(12) United States Patent
Shen et al.

(10) Patent No.: US 8,847,252 B2
(45) Date of Patent: *Sep. 30, 2014

(54) III-NITRIDE LIGHT EMITTING DEVICE WITH DOUBLE HETEROSTRUCTURE LIGHT EMITTING REGION

(75) Inventors: Yu-Chen Shen, Sunnyvale, CA (US); Nathan F. Gardner, Sunnyvale, CA (US); Satoshi Watanabe, Cupertino, CA (US); Michael R. Krames, Mountain View, CA (US); Gerd O. Mueller, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/495,464

(22) Filed: Jun. 30, 2009

(65) Prior Publication Data

US 2009/0261361 A1 Oct. 22, 2009

Related U.S. Application Data

(63) Continuation of application No. 11/682,276, filed on Mar. 5, 2007, now Pat. No. 7,880,186, which is a continuation of application No. 11/211,921, filed on Aug. 24, 2005, now abandoned.

(51) Int. Cl.
*H01L 33/32* (2010.01)
*H01L 33/04* (2010.01)
*H01L 33/06* (2010.01)

(52) U.S. Cl.
CPC ............... *H01L 33/32* (2013.01); *H01L 33/06* (2013.01)
USPC ..................... 257/94; 257/E33.034

(58) Field of Classification Search
CPC ............................... H01L 33/06; H01L 33/32
USPC ............ 257/79–103, 191, E33.026, E33.027, 257/E33.028, E33.048, E33.049, E33.034
See application file for complete search history.

(56) References Cited

U.S. PATENT DOCUMENTS

| | | | |
|---|---|---|---|
| 5,747,832 A * | 5/1998 | Nakamura et al. | 257/103 |
| 5,903,017 A * | 5/1999 | Itaya et al. | 257/190 |
| 5,959,401 A | 9/1999 | Asami et al. | |
| 6,469,323 B1 | 10/2002 | Nakamura et al. | |
| 6,515,313 B1 * | 2/2003 | Ibbetson et al. | 257/103 |
| 6,590,234 B2 * | 7/2003 | Kim et al. | 257/94 |

(Continued)

FOREIGN PATENT DOCUMENTS

| | | |
|---|---|---|
| EP | 0890997 A2 | 1/1999 |
| EP | 1560276 | 3/2005 |

(Continued)

OTHER PUBLICATIONS

Mukai et al, "High-power UV InGaN/AlGaN double-heterostructure LEDs" Journal of Crystal Growth, vol. 189-190, Jun. 15, 1998, pp. 778-781.

(Continued)

*Primary Examiner* — Yu Chen

(57) ABSTRACT

A III-nitride light emitting layer is disposed between an n-type region and a p-type region in a double heterostructure. At least a portion of the III-nitride light emitting layer has a graded composition.

19 Claims, 9 Drawing Sheets

(56) References Cited

U.S. PATENT DOCUMENTS

| | | |
|---|---|---|
| 6,630,692 B2 | 10/2003 | Goetz et al. |
| 6,635,904 B2 | 10/2003 | Goetz et al. |
| 6,833,564 B2 | 12/2004 | Shen et al. |
| 6,835,957 B2 | 12/2004 | Stockman |
| 6,914,272 B2 | 7/2005 | Goetz et al. |
| 7,115,908 B2 | 10/2006 | Watanabe |
| 7,122,839 B2 * | 10/2006 | Shen et al. .................. 257/79 |
| 7,285,799 B2 | 10/2007 | Kim et al. |
| 2002/0093020 A1 | 7/2002 | Edmond et al. |
| 2002/0171092 A1 | 11/2002 | Goetz |
| 2002/0190259 A1 | 12/2002 | Goetz et al. |
| 2003/0020085 A1 * | 1/2003 | Bour et al. .................. 257/101 |
| 2003/0085409 A1 | 5/2003 | Shen et al. |
| 2003/0160229 A1 | 8/2003 | Narayan |
| 2004/0026710 A1 * | 2/2004 | Tsuda et al. .................. 257/103 |
| 2004/0031437 A1 | 2/2004 | Sarayama et al. |

FOREIGN PATENT DOCUMENTS

| | | |
|---|---|---|
| EP | 1560277 | 8/2005 |
| JP | 06260682 A | 9/1994 |
| JP | 10107319 | 4/1998 |
| JP | 2002299685 | 11/2002 |
| JP | 2005217415 | 8/2005 |
| JP | 2005217421 | 8/2005 |

OTHER PUBLICATIONS

Kneissl et al, "Room-temperature continuous-wave operation of InGaN multiple-quantum-well laser diodes with an asymmetric waveguide structure", Applied Physics Letters, American Institute of Physics, vol. 75, No. 4, Jul. 26, 1999, pp. 581-583.

J. Bai et al, "Influence of the quantum-well lthickness on the radiative recombination of InGaN/GaN quantum well structures", Journal of Applied Physics, vol. 88, No. 8, Oct. 15, 2000, pp. 4729-4733.

Yun-Li Li et al, "Investigation of Efficiency Droop Behaviors of InGaN/GaN Multiple-Quantum-Well LEDs With Various Well Thicknesses", IEEE Journal of Selected Topics in Quantum Electronics, vol. 15, No. 4, Jul./Aug. 2009, pp. 1128-1131.

Y.L. Li et al, "Efficiency droop behaviors of InGaN/GaN multiple-quantum-well light-emitting diodes with varying quantum well thickness", Applied Physics Letters 91, 181113, 2007, pp. 181113.1-181113.3.

Shuji Nakamura et al, "High-brightness InGaN/AlGaN double-heterostructure blue-green-light-emitting diodes", J. Appl. Phys. 76 (12), Dec. 15, 1994, American Institute of Physics, pp. 8189-8191.

Shuji Nakamura et al, "Candela-class high-brightness InGaN/AlGaN double-heterostructure blue-light-emitting diodes", Appl. Phys. Lett. 64 (13), Mar. 28, 1994, American Institute of Physics, pp. 1687-1689.

Shuji Nakamura et al, "P—GaN/N—InGaN/N—GaN Double-Heterostructure Blue-Light-Emitting Diodes", Jpn. J. Appl. Phys. vol. 32 (1993), Part 2, No. 1A/B, Jan. 15, 1993, pp. L8-L11.

* cited by examiner

III-NITRIDE LIGHT EMITTING DEVICE WITH DOUBLE HETEROSTRUCTURE LIGHT EMITTING REGION

CROSS REFERENCE TO RELATED APPLICATIONS

This application is a continuation of U.S. patent application Ser. No. 11/211,921, filed Aug. 24, 2005. U.S. patent application Ser. No. 11/211,921 is incorporated herein by reference.

BACKGROUND

1. Field of Invention

This invention relates to the light emitting region of a semiconductor light emitting device.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates, such as sapphire, with both contacts on the same side of the device. Such devices are mounted so light is extracted either through the contacts (known as an epitaxy-up device) or through a surface of the device opposite the contacts (known as a flip chip device).

U.S. Pat. No. 5,747,832 teaches a "light emitting gallium nitride-based compound semiconductor device of a double-heterostructure. The double-heterostructure includes a light-emitting layer formed of a low-resistivity $In_xGa_{1-x}N$ ($0<x<1$) compound semiconductor doped with p-type and/or n-type impurity." See U.S. Pat. No. 5,747,832, abstract. Specifically, column 5 lines 45-50 recite "[i]n the present invention, the light-emitting layer 18 preferably has a thickness within a range such that the light-emitting device of the present invention provides a practical relative light intensity of 90% or more. In more detail, the light-emitting layer 18 preferably has a thickness of 10 Å to 0.5 μm, and more preferably 0.01 to 0.2 μm." Column 10 lines 44-49 teach "[i]n the third embodiment, the n-type impurity doped in $In_xGa_{1-x}N$ of the light-emitting layer 18 is preferably silicon (Si). The concentration of the n-type impurity is preferably $1\times10^{17}/cm^3$ to $1\times10^{21}/cm^3$ from the viewpoint of the light emission characteristics, and more preferably $1\times10^{18}/cm^3$ to $1\times10^{20}/cm^3$."

Commercial III-nitride devices with InGaN light emitting layers often have multiple quantum well light emitting layers less than 50 Å and typically doped to less than about $1\times10^{18}$ $cm^{-3}$, as these quantum well designs can improve performance, especially in poor quality epitaxial material, at low drive current. At higher drive currents desirable for lighting, these devices suffer decreasing efficiency with increasing current density. Needed in the art are devices that exhibit high efficiency at high current density.

SUMMARY

In accordance with embodiments of the invention, a III-nitride light emitting layer is disposed between an n-type region and a p-type region in a double heterostructure. At least a portion of the III-nitride light emitting layer has a graded composition.

DETAILED DESCRIPTION

Figure 1:
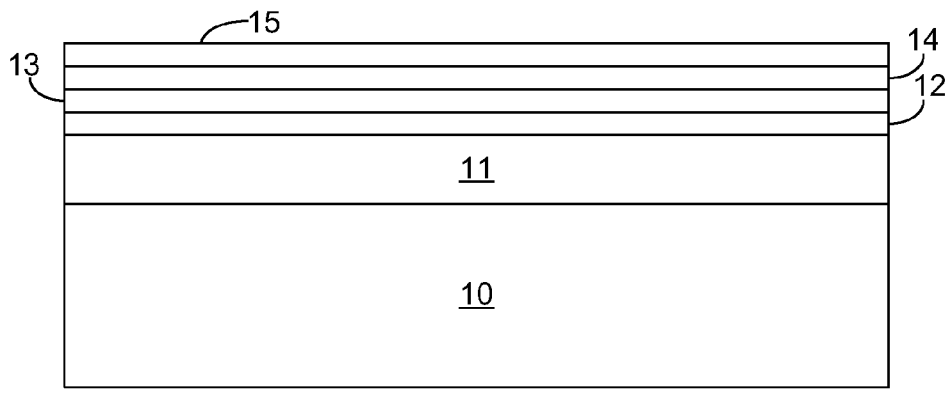
FIG. 1 illustrates a III-nitride light emitting device.

FIG. 1 illustrates a common III-nitride light emitting device. An n-type region 11 is grown over a sapphire substrate 10. An active region 12, including multiple thin quantum well layers separated by barrier layers, is grown over n-type region 11, followed by a GaN spacer layer 13, a p-type AlGaN layer 14, and a p-type contact layer 15.

Figure 2:
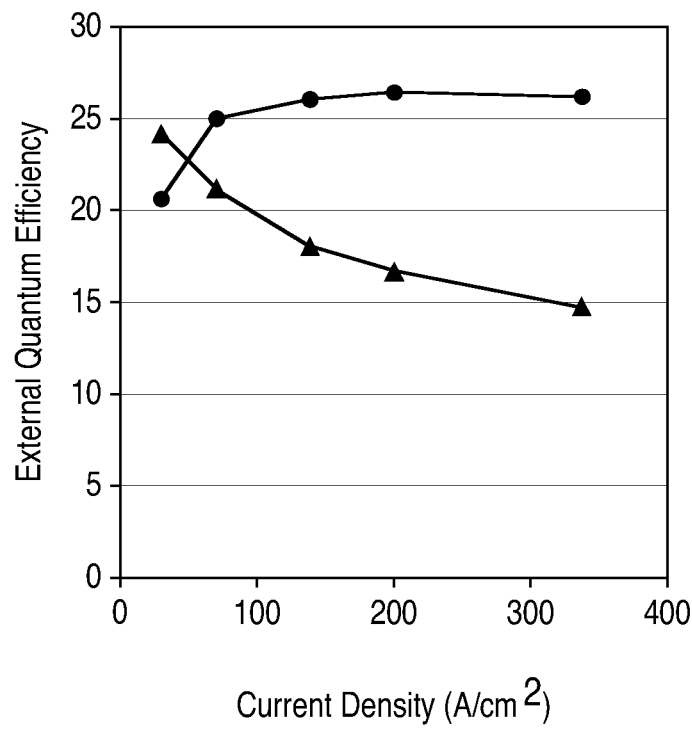
FIG. 2 is a plot of external quantum efficiency as a function of current density for a device as shown in FIG. 1 and a device according to embodiments of the present invention.

FIG. 2 illustrates the external quantum efficiency of a device such as the device of FIG. 1 (triangles on FIG. 2) and a device according to an embodiment of the present invention (circles on FIG. 2). The external quantum efficiency is the internal quantum efficiency, defined as the flux of photons produced divided by the flux of carriers supplied, multiplied by the extraction efficiency. For a given lamp design, the extraction efficiency is constant, thus the extraction efficiency is the same for both devices shown in FIG. 2. As the current density applied to the device of FIG. 1 increases, the external quantum efficiency of the device initially increases, then decreases, as illustrated in FIG. 2. As the current density increases past zero, the external quantum efficiency increases, reaching a peak at a current density of about 10 A/cm$^2$. As current density increases beyond 10 A/cm$^2$, the external quantum efficiency drops quickly, then the decrease in external quantum efficiency slows at high current density, for example beyond 200 A/cm$^2$. Embodiments of the invention are designed to reduce or reverse the drop in quantum efficiency at high current density.

In accordance with embodiments of the invention, III-nitride light emitting devices include a thick double heterostructure light emitting region that is highly doped. Though the embodiments below describe devices where the light emitting layer is doped n-type with Si, it is to be understood that in other embodiments, other dopant species including p-type dopant species may be used. The thick double heterostructure light emitting region may reduce charge carrier density, and doping in and adjacent to the light emitting region may improve the material quality of the light emitting region, both of which may reduce the number of carriers lost to nonradiative recombination. Embodiments of the invention are designed to reduce or reverse the drop in quantum efficiency at high current density observed in FIG. 2 for the device of FIG. 1.

Figure 3:
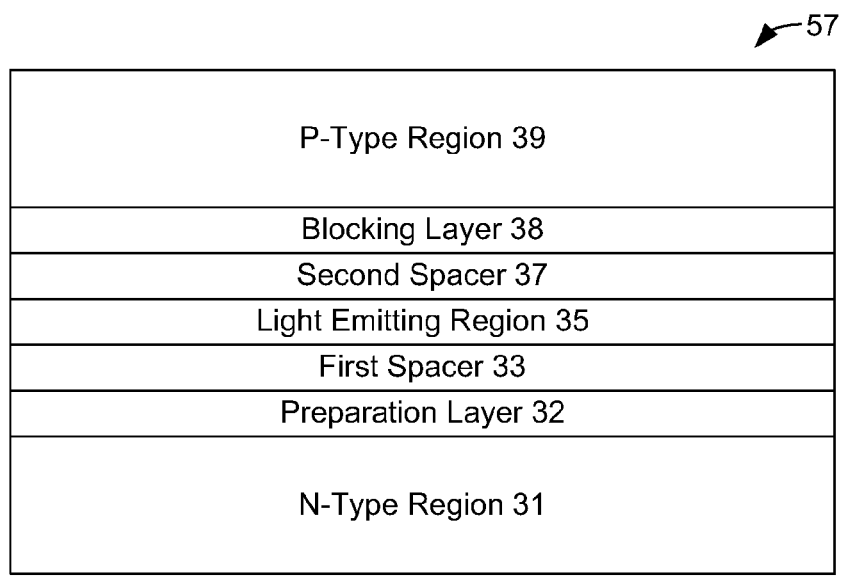
FIG. 3 illustrates a III-nitride light emitting device according to embodiments of the invention.

FIG. 3 illustrates a light emitting device according to embodiments of the invention. A light emitting region 35 is sandwiched between an n-type region 31 and a p-type region 39. Light emitting region 35 may be spaced apart from n-type region 31 and p-type region 39 by optional first and second spacer layers 33 and 37. The device may include an optional preparation layer 32 disposed between n-type region 31 and first spacer 33, and/or an optional blocking layer 38, disposed between second spacer 37 and p-type region 39.

Rather than thin quantum well layers separated by barrier layers, light emitting region 35 may include one or more thick light emitting layers, for example thicker than 50 angstroms. In some embodiments, light emitting region 35 includes a single, thick light emitting layer with a thickness between 50 and 600 angstroms, more preferably between 100 and 250 angstroms. The upper limit on thickness is due to current growth techniques which result in poor material quality as the thickness of the light emitting layer increases beyond 600 angstroms, for example at thicknesses above 1000 angstroms. Poor material quality typically results in reduced internal quantum efficiency. As growth techniques improve, growth of devices with thicker light emitting layers without reduced internal quantum efficiency may be possible and thus within the scope of embodiments of the invention.

The optimal thickness may depend on the number of defects within the light emitting layer. In general, as the number of defects increases, the optimal thickness of the light emitting layer decreases. In addition, defects may be centers for nonradiative recombination, thus it is desirable to reduce the number of defects as much as possible. A comment defect in III-nitride materials is a threading dislocation. The concentration of threading dislocations is measured per unit area. The concentration of threading dislocations in the light emitting region is preferably limited to less than $10^9$ cm$^{-2}$, more preferably limited to less than $10^8$ cm$^{-2}$, more preferably limited to less than $10^7$ cm$^{-2}$, and more preferably limited to less than $10^6$ cm$^{-2}$. Achieving the above-described threading dislocation concentrations may require growth techniques such as epitaxial lateral overgrowth, hydride vapor phase epitaxy, and growth on freestanding GaN substrates. Epitaxial lateral overgrowth involves selective growth of GaN over openings in a mask layer formed on GaN layer grown on a conventional growth substrate such as sapphire. The coalescence of the selectively-grown GaN may enable the growth of a flat GaN surface over the entire growth substrate. Layers grown subsequent to the selectively-grown GaN layer may exhibit low defect densities. Epitaxial lateral overgrowth is described in more detail in Mukai et al., "Ultraviolet InGaN and GaN Single-Quantum Well-Structure Light-Emitting Diodes Grown on Epitaxial Laterally Overgrown GaN Substrates," Jpn. J. Appl. Phys. Vol. 38 (1999) p. 5735, which is incorporated herein by reference. Hydride vapor phase epitaxial growth of freestanding GaN substrates is described in more detail in Motoki et al., "Preparation of Large Freestanding GaN Substrates by Hydride Vapor Phase Epitaxy Using GaAs as a Starting Substrate," Jpn. J. Appl. Phys. Vol. 40 (2001) p. L140, which is incorporated herein by reference.

Figure 4:
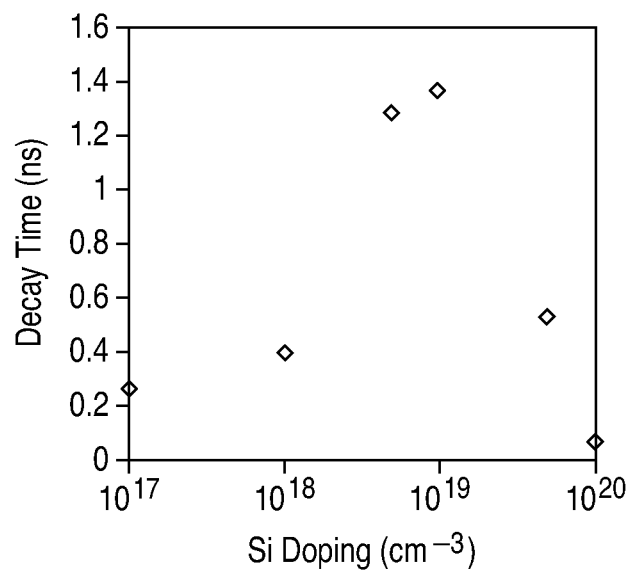
FIG. 4 is a plot of decay time as a function of silicon doping level for several InGaN films.

In addition to being thick, the light emitting layers of light emitting region 35 region are doped, for example doped n-type with Si. In some embodiments, Si is used as the dopant because Si may provide other improvements to the material, such as a rough surface that may improve light extraction from the device or relieve strain in the light emitting layer. FIG. 4 is a plot of decay time as a function of silicon doping level for several InGaN films. To gather the data illustrated in FIG. 4, InGaN films doped to the levels illustrated were probed with a laser at low excitation intensities. The lifetimes of the carriers, i.e. the length of time before a carrier is consumed by a defect, were measured. A longer lifetime indicates better material quality in the film; a shorter lifetime indicates worse material quality. As illustrated in FIG. 4, InGaN films doped to between $6 \times 10^{18}$ and $2 \times 10^{19}$ cm$^{-3}$ have the longest lifetimes, indicating that nonradiative recombination is slowest in these films. FIG. 4 demonstrates that the rate of nonradiative recombination may be influenced by Si-doping levels in the light emitting layers.

Figure 9A:
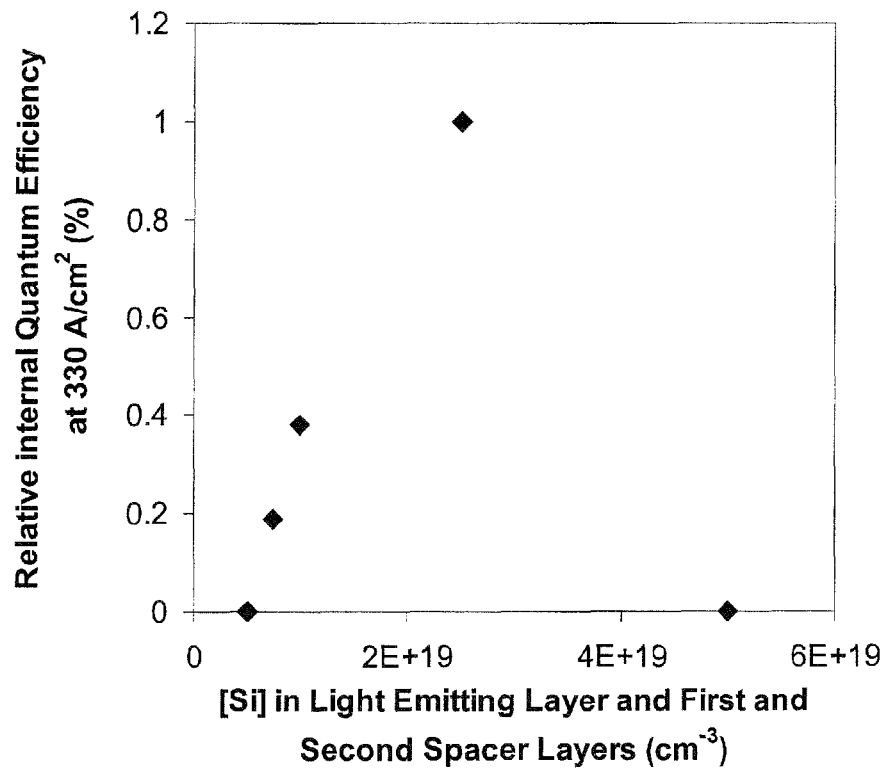
FIGS. 9A and 9B illustrate relative internal quantum efficiency as a function of silicon doping level in the light emitting layer and first and second spacer layers for devices according to embodiments of the invention emitting light at 450 nm and 400 nm, respectively.
Figure 9B:
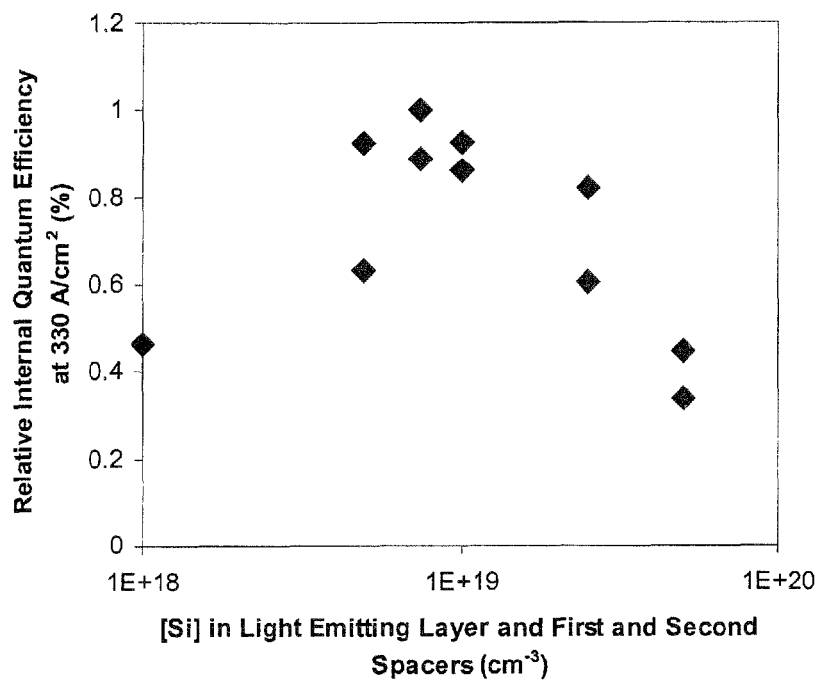

FIG. 9A illustrates the internal quantum efficiency at 330 A/cm$^2$ as a function of silicon doping level for devices with 96 angstrom thick In$_{0.16}$Ga$_{0.84}$N light emitting layers which emit light at a peak wavelength of about 450 nm. FIG. 9B illustrates the internal quantum efficiency at 330 A/cm$^2$ as a function of silicon doping level for devices with 96 angstrom thick In$_{0.08}$Ga$_{0.92}$N light emitting layers which emit light at a peak wavelength of about 400 nm. As in FIG. 4, FIGS. 9A and 9B illustrate that devices with InGaN light emitting layers with silicon doping levels between about $6 \times 10^{18}$ and $3 \times 10^{19}$ cm$^{-3}$ have the highest internal quantum efficiency. In particular, FIG. 9A illustrates a peak in internal quantum efficiency at 330 A/cm$^2$ at about $2 \times 10^{19}$ cm$^{-3}$ for a device emitting light at a peak wavelength of about 450 nm. FIG. 9B illustrates a peak in internal quantum efficiency at about $8 \times 10^{18}$ cm$^{-3}$ for a device emitting light at a peak wavelength of about 400 nm. As the doping level in the light emitting layer drops below $6 \times 10^{18}$ cm$^{-3}$ or increases above $3 \times 10^{19}$ cm$^{-3}$, the internal quantum efficiency drops. As the silicon doping level increases beyond $3 \times 10^{19}$ cm$^{-3}$ the material quality becomes poor.

The circles in FIG. 2 illustrate the external quantum efficiency as a function of current density for a device according to embodiments of the invention. In the device illustrated by the circles in FIG. 2, a 130 angstrom thick In$_{0.12}$Ga$_{0.88}$N light emitting layer is doped with Si to a concentration of $10^{19}$ cm$^{-3}$. This device emits light at about 430 nm. In contrast to the device of FIG. 1, illustrated in FIG. 2 by triangles, in the device according to the embodiments of the invention, the external quantum efficiency improves as the current density increases, then levels off at an external quantum efficiency of about 26% at a current density of about 250 A/cm$^2$. At the same current density, the device of FIG. 1 has an external quantum efficiency of only about 18%, which drops as the current density increases.

Figure 10:
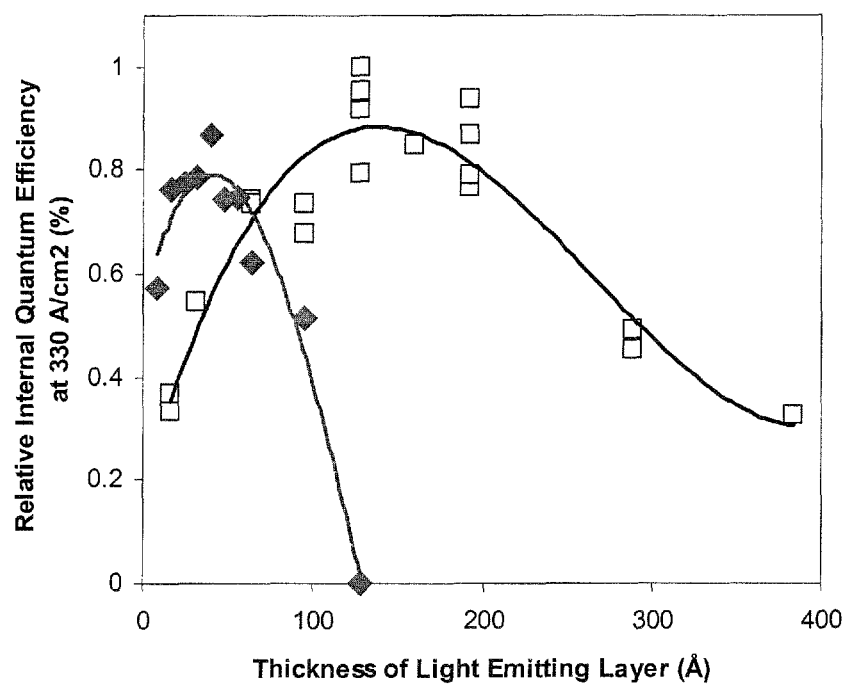
FIG. 10 illustrates relative internal quantum efficiency as a function of light emitting layer thickness for several devices.

In some embodiments, device performance significantly improves only when the optimal thicknesses according to embodiments of the invention and the optimal silicon doping levels according to embodiments of the invention are implemented together, as illustrated in FIG. 10, which is a plot of internal quantum efficiency at 330 A/cm$^2$ as a function of light emitting layer thickness for several devices. The diamonds in FIG. 10 represent devices with a light emitting layer with a threading dislocation density of $1.5 \times 10^9$ cm$^{-2}$ doped to $10^{18}$ cm$^-$, a doping level below the optimal silicon doping ranges described above. The squares in FIG. 10 represent a device with a light emitting layer with a threading dislocation density of $4 \times 10^3$ cm$^{-2}$ doped to $10^{19}$ cm$^{-3}$, a doping level within the optimal silicon doping ranges described above.

As illustrated by the diamonds in FIG. 10, for a light emitting layer doped to less than the optimal doping levels described above, the internal quantum efficiency drops as the thickness of the light emitting layer increases into the optimal thickness ranges described above. For example, the internal quantum efficiency for a device with a light emitting layer doped to $10^{18}$ cm$^{-3}$ drops from a peak at a light emitting layer thickness less than 50 angstroms, to zero at a light emitting layer thickness of about 130 angstroms. In contrast, as illustrated by the squares in FIG. 10, at the optimal doping levels described above, at a light emitting layer thickness between about 80 angstroms and about 230 angstroms, the internal quantum efficiency is above the peak internal quantum efficiency observed for the light emitting layer doped to only $10^{18}$ cm$^{-3}$.

FIG. 10 also illustrates that even if the light emitting layer is doped to the optimal doping levels described above, the internal quantum efficiency of the device suffers if the light emitting layer thickness is outside the optimal thickness range described above. For example, the squares in FIG. 10 illustrate that at 30 angstroms, a common thickness for thin quantum wells in a device such as illustrated in FIG. 1 and a thickness below the optimal light emitting layer thicknesses described above, a device with a light emitting layer doped to an optimal doping level of $10^{19}$ cm$^{-3}$ still demonstrates very low internal quantum efficiency. Thus, in some embodiments both the light emitting layer thickness and the light emitting layer dopant concentration must be within the optimal ranges described above in order to realize improvements in internal quantum efficiency.

In some embodiments, silicon-doped first and second spacer layers 33 and 37 are combined with the optimal light emitting region thicknesses and doping levels described above. As illustrated in Table 1 below, the internal quantum efficiency of a thick, optimally silicon-doped light emitting layer may be further boosted by doping to the same doping ranges the spacer layers directly adjacent to the light emitting layer. The spacer layers may be, for example, between about 20 and about 1000 angstroms thick, and are usually about 100 angstroms thick.

TABLE 1

Relative Internal Quantum Efficiency at 330 A/cm$^2$ for 64 Å InGaN Light Emitting Layers

| | | Spacer Layer Doping | |
| --- | --- | --- | --- |
| | | $10^{18}$ cm$^{-3}$ | $10^{19}$ cm$^{-3}$ |
| Light Emitting Layer Doping | $10^{19}$ cm$^{-3}$ | 31% | 41% |
| | $10^{18}$ cm$^{-3}$ | 9.4% | 39% |

The data illustrated in FIGS. 2, 4, and 10 and in Table 1 are for devices with InGaN light emitting layers with 12% InN, which emit light at about 430 nm. Increasing the wavelength of emitted light requires increasing the amount of InN in the light emitting layer. In general, as the amount of InN in a layer increases, the material quality of the layer deteriorates. Accordingly, devices with more InN in the light emitting layers may require greater dopant concentrations in the light emitting layers, in order to achieve the improvements in efficiency, as illustrated in FIGS. 2, 9A, and 10. For example, in devices with InGaN light emitting layers with 16% InN, which emit light at about 450 nm, the optimal silicon doping level may be, for example, $1 \times 10^{19}$ cm$^{-3}$ to $5 \times 10^{91}$ cm$^{-3}$ as illustrated in FIG. 9A, instead of $6 \times 10^{18}$ cm$^{-3}$ to $10^{19}$ cm$^{-3}$ as illustrated in FIG. 9B for a device emitting light at 400 nm.

The above examples describe optimal thicknesses and doping levels for each of the first spacer layer 33, light emitting region 35, and second spacer layer 37. In various embodiments one or more of regions 33, 35, and 37 may not be intentionally doped or may be doped to a level below the optimal doping ranges given above. For example, all three of regions 33, 35, and 37 may be optimally doped; spacer layer 33 and light emitting region 35 may be optimally doped and spacer layer 37 may not be intentionally doped or may be doped to a level below the optimal range; spacer layer 37 and light emitting region 35 may be optimally doped and spacer layer 33 may not be intentionally doped or may be doped to a level below the optimal range; or both spacer layers 33 and 37 may be optimally doped and light emitting region 35 may not be intentionally doped or may be doped to a level below the optimal range.

In some embodiments, the internal quantum efficiency of the device may be further improved by including an optional current blocking layer 38, as illustrated in FIG. 3. Blocking layer 38 confines current within the light emitting layer, and in some embodiments is an aluminum-containing p-type layer, often p-type AlGaN or p-type AlInGaN. The internal quantum efficiency in a device is a function of the product of the current injection efficiency and the radiative recombination efficiency. The current injection efficiency is the ratio of the amount of current that recombines in the light emitting layer to the amount of current supplied to the device. The radiative recombination efficiency is the ratio of the amount of current that recombines in the light emitting layer and emits light (in contrast to current that recombines in the light emitting layer for example in a crystal defect, and does not emit light) to the total amount of current that recombines in the light emitting layer.

Figure 11:
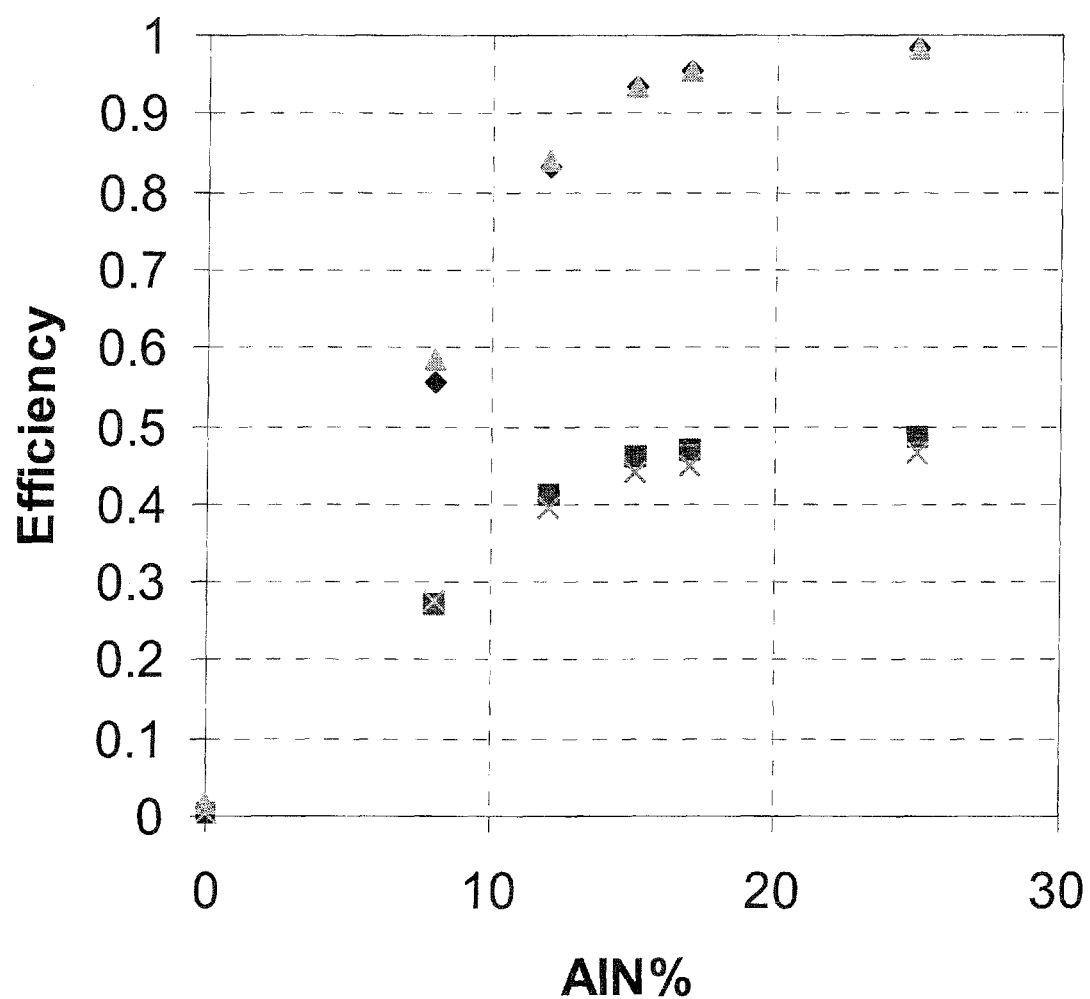
FIG. 11 illustrates injection efficiency and internal quantum efficiency as a function of blocking layer composition for several simulated devices.

The injection efficiency is sensitive to the composition of AlN in blocking layer 38. The "height" of the barrier provided by blocking layer 38 is determined by the composition of AlN in the blocking layer, the magnitude of sheet charges at the interface between blocking layer 38 and spacer layer 37, and the doping in blocking layer 38 and surrounding layers. FIG. 11 illustrates the injection efficiency and internal quantum efficiency as a function of composition of AlN in blocking layer 38 for devices with $In_{0.12}Ga_{0.88}N$ and $In_{0.16}Ga_{0.84}N$ light emitting layers according to embodiments of the invention. The data in FIG. 11 were derived from simulations. The diamonds and squares in FIG. 11 represent the injection efficiency and internal quantum efficiency of a device with an $In_{0.16}Ga_{0.84}N$ light emitting layer; the triangles and x-marks on FIG. 11 represent the injection efficiency and internal quantum efficiency of a device with an $In_{0.12}Ga_{0.88}N$ light emitting layer. At 0% AlN in blocking layer 38, the injection efficiency and internal quantum efficiency are both about zero. As the composition of AlN in blocking layer increases to 8%, the injection efficiency jumps to over 50%. As the composition of AlN increases above 8%, the injection efficiency improves. For an injection efficiency greater than 90%, the AlN composition may be at least 15%.

Figure 12:
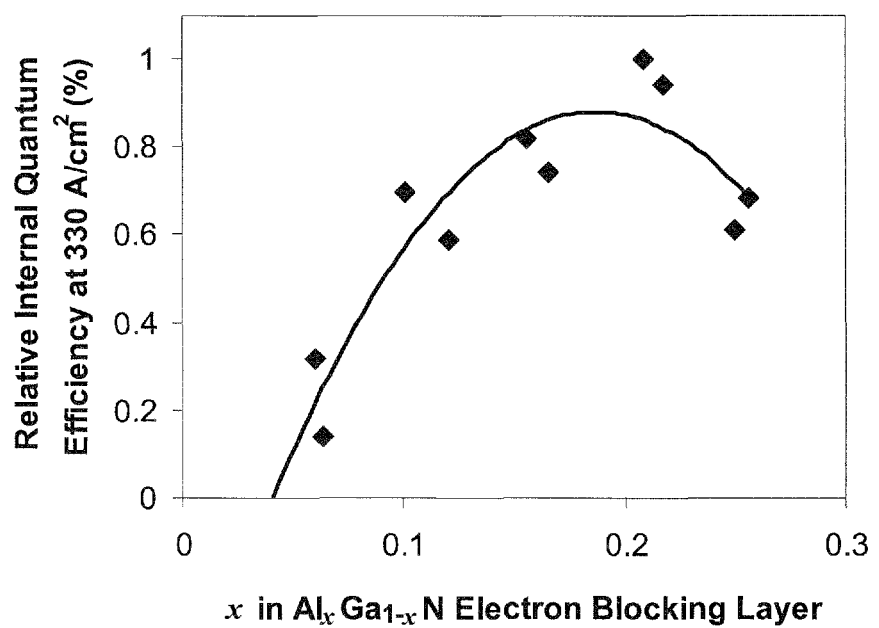
FIG. 12 illustrates relative internal quantum efficiency as a function of blocking layer composition observed in actual devices.
Figure 13A:
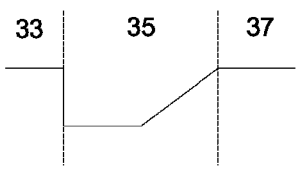
FIGS. 13A-13K illustrate portions of the conduction band for devices including grading in the light emitting region.
Figure 13B:
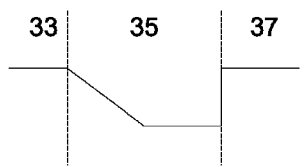
Figure 13C:
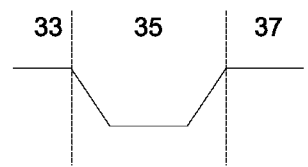
Figure 13D:
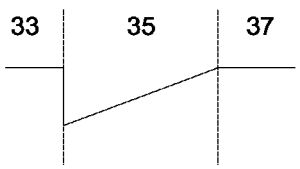
Figure 13E:
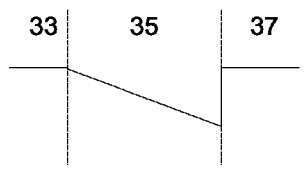
Figure 13F:
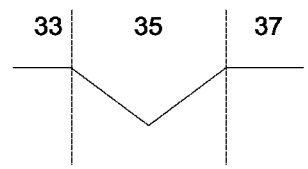
Figure 13G:
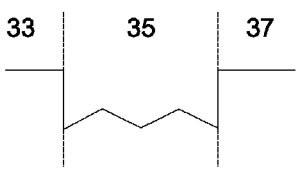
Figure 13H:
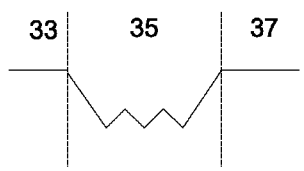
Figure 13I:
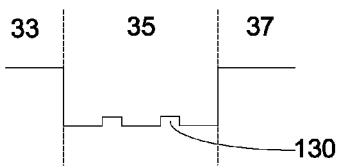
Figure 13J:
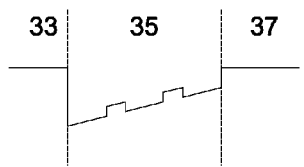
Figure 13K:
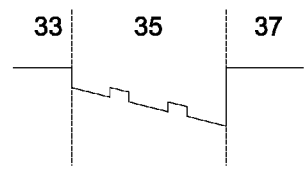

FIG. 12 illustrates the internal quantum efficiency as a function of composition of AlN in blocking layer 38, as observed in actual devices that emit light at 430 nm. As illustrated in FIG. 12, as the composition of AlN in blocking layer increases above 0%, the internal quantum efficiency improves to a peak in internal quantum efficiency at an AlN composition of about 20%. Accordingly, in some embodiments of the device, the AlN composition in an AlGaN blocking layer is greater than 8% and less than 30%, preferably greater than 15% and less than 25%. The reduction in internal quantum efficiency as the AlN composition increases over 20% may be due to incorporation of contaminants during growth of high AlN composition layers.

The AlN compositions described above may be generalized to desirable band gaps for blocking layer 38, as illustrated below in Table 2. The data in Table 2 are calculated by the equation $E_{g,Al_xGa_{1-x}N} = E_{g,GaN} \cdot (1-x) + E_{g,AlN} \cdot x - bx(1-x)$ where $E_{g,GaN}$ is the band gap of GaN, 3.4 eV, $E_{g,AlN}$ is the band gap of AlN, 6.2 eV, and b is a bowing parameter, 1 eV at room temperature.

TABLE 2

Band Gap for $Al_xGa_{1-x}N$ Blocking Layers

| x, Composition of AlN | $E_{g,\,AlGaN}$ (eV) |
|---|---|
| 0.05 | 3.49 |
| 0.08 | 3.55 |
| 0.12 | 3.63 |
| 0.15 | 3.69 |
| 0.17 | 3.73 |
| 0.20 | 3.80 |
| 0.25 | 3.89 |

As illustrated in Table 2 AlN compositions between 8% and 25% correspond to band gaps between 3.55 and 3.89 eV. Accordingly, in embodiments of the invention, blocking layer may be a layer of any composition with a band gap greater than 3.5 eV. Since the upper limit on AlN composition illustrated in FIG. 12 is likely due to materials problems particular to current growth techniques for AlGaN layers and not due to band gap, the upper limit to the band gap of an AlGaN blocking layer is that of an AlN blocking layer, assuming these material problems are resolved.

Blocking layer 38 must be thick enough so charge carriers cannot tunnel through blocking layer 38, generally greater than 10 Å thick. In some embodiments, blocking layer 38 is between 10 and 1000 Å thick, more preferably between 100 and 500 Å thick. In some embodiments, blocking layer 38 may be part of or the entire p-type region 39; for example, blocking layer 38 may be a layer on which an electrical contact to the p-type side of the light emitting layer is formed.

In some embodiments, the internal quantum efficiency of the device may be further improved by including an optional preparation layer 32, as illustrated in FIG. 3. Preparation layer 32 may be a smoothing structure as described in U.S. Pat. No. 6,635,904, "Indium Gallium Nitride Smoothing Structures For III-nitride Devices," granted Oct. 21, 2003, and incorporated herein by reference. Preparation layer 32 is formed over n-type region 31. The preparation layer may be an n-type layer located beneath the light emitting layer, within 5000 angstroms of the light emitting layer. The preparation layer can have a thickness ranging from about 200 angstroms to several microns. Preparation layer 32 has a lower indium composition than light emitting region 35; for example, preparation layer 32 may be an InGaN layer containing 2-12% InN, and more preferably containing 2-6% InN. In some embodiments, preparation layer 32 may be part of n-type region 31; for example, preparation layer 32 may be a layer on which an electrical contact to the n-type side of the light emitting layer is formed.

In addition to the decrease in efficiency at high current density, the device of FIG. 1 may also exhibit a peak wavelength that shifts as the current density applied to the device increases. Device designs according to embodiments of the invention may desirably reduce or eliminate the shift in the peak wavelength as the current density increases, as illustrated in Table 3. The devices in Table 3 labeled "FIG. 3 Device" have 130 angstrom thick light emitting layers doped with Si to a concentration of $1\times10^{19}$ cm$^{-3}$ that emit light at a peak wavelength of about 430 nm, 200 angstrom thick GaN first spacer layers doped with Si to a concentration of $1\times10^{19}$ cm$^{-3}$, 100 angstrom thick GaN second spacer layers doped with Si to a concentration of $1\times10^{19}$ cm$^{-3}$, and 210 angstrom thick $Al_{0.16}Ga_{0.84}N$ blocking layers.

TABLE 3

Peak Wavelength Shift for Devices According to Embodiments of the Invention and Devices According to FIG. 1:

| Current Density Change | Wavelength shift, FIG. 1 Device | Wavelength Shift, FIG. 3 Device |
|---|---|---|
| From 20 to 930 A/cm$^2$ | 8 nm | 3 nm |
| From 20 to 400 A/cm$^2$ | 6 nm | 2 nm |
| From 20 to 200 A/cm$^2$ | 4 nm | 1 nm |

Though in the above examples each device includes only a single light emitting layer, some embodiments of the invention include multiple light emitting layers separated by barriers. In addition, though the above examples use silicon as the dopant in the light emitting region and surrounding layers, in some embodiments other suitable dopants may be used in addition to or instead of silicon, such as other group IV elements such as germanium and tin, group VI elements such as oxygen, selenium, tellurium, and sulfur, group III elements such as aluminum or boron, and p-type dopants such as magnesium. Finally, though the examples above describe devices with InGaN light emitting layers that typically emit light in the near-UV through infrared range, in other embodiments the light emitting layer or spacer layers may be GaN, AlGaN, or AlInGaN, and the devices may emit UV through red light.

Though in the examples described above each doped layer or region (such as the light emitting layer or spacer layers) is uniformly doped, in other embodiments one or more doped layers or regions may be partially doped, or the doping may be graded. Alternatively or in addition, the composition of one or more layers described above may be graded. As used herein, the term "graded" when describing the composition or dopant concentration in a layer or layers in a device is meant to encompass any structure that achieves a change in composition and/or dopant concentration in any manner other than a single step in composition and/or dopant concentration. In one example, doping in one or both of the spacer layers is graded. In another example, the InN composition in the light emitting layer is graded. Each graded layer may be a stack of sublayers, each of the sublayers having a different dopant concentration or composition from either sublayer adjacent to it. If the sublayers are of resolvable thickness, the graded layer is a step-graded layer. In the limit where the thickness of individual sublayers approaches zero, the graded layer is a continuously-graded region. The sublayers making up each graded layer can be arranged to form a variety of profiles in composition and/or dopant concentration versus thickness, including, but not limited to, linear grades, parabolic grades, and power-law grades. Also, graded layers are not limited to a single grading profile, but may include portions with different grading profiles and one or more portions with substantially constant composition and/or dopant concentration regions.

FIGS. 13A-13K illustrate several grading schemes for the light emitting region 35 of FIG. 3. FIGS. 13A-13K illustrate a portion of the conduction band of energy band diagrams including first spacer 33, light emitting region 35, and second spacer layer 37. In a device with an InGaN light emitting region 35, the larger the band gap, i.e. the higher the level shown on each figure, the less InN is present. Thus, taking FIG. 13A as an example, first spacer layer 33 is GaN or InGaN with no InN or a low composition of InN. The InN composition is increased and held constant in a first portion of InGaN light emitting layer 35, then the InN composition is graded to zero or a low composition at the interface with second spacer layer 37. In FIGS. 13G-13K, there are one or more local maxima 130 in the band gap within light emitting region 35. In an InGaN light emitting region 35, these local maxima in band gap represent regions with lower InN composition than the surrounding regions of light emitting region 35. In some embodiments, the difference in band gap between these local maxima and the regions of light emitting region 35 surrounding them is small enough that the maxima do not have electronic states, meaning there is no quantum confinement in the regions between them, thus the regions between them are not quantum wells.

Figure 7:
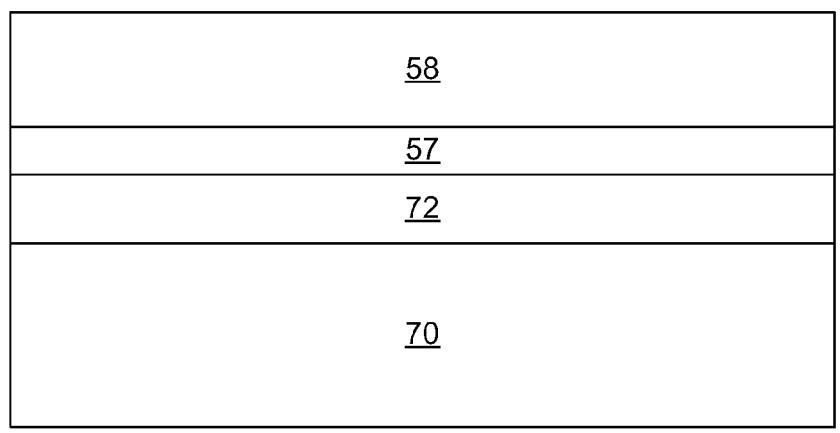
FIG. 7 illustrates a thin film light emitting device.
Figure 5:
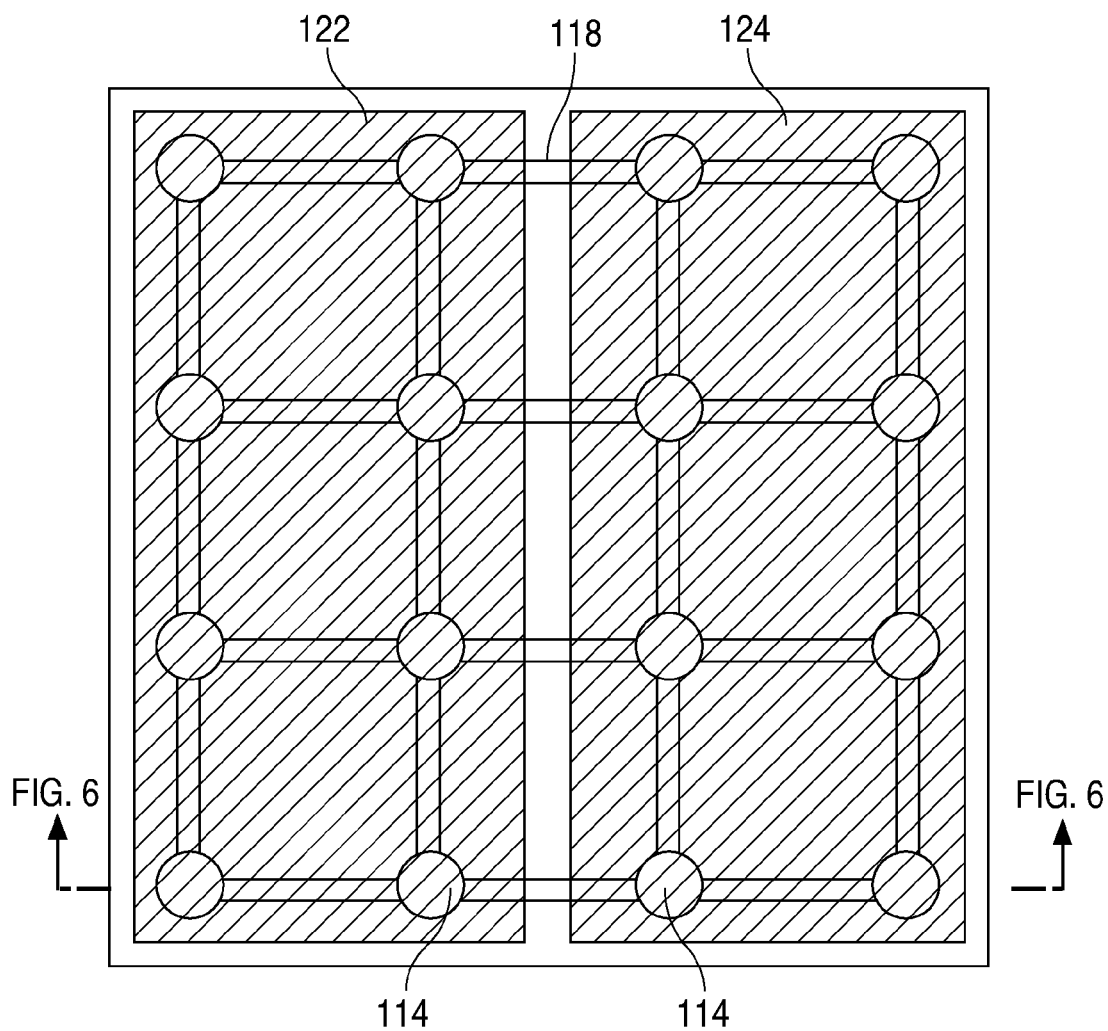
FIGS. 5 and 6 are a plan view and a cross sectional view of a large junction flip chip light emitting device.
Figure 6:
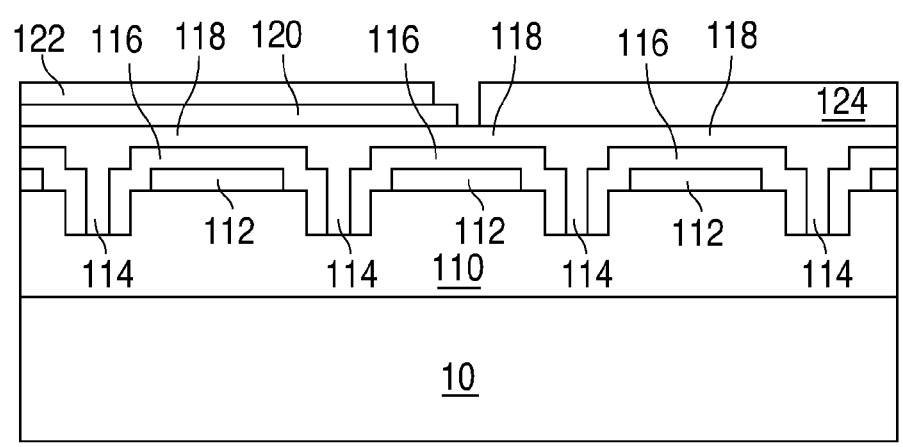

The semiconductor structure illustrated in FIG. 3 may be included in any configuration of a light emitting device. FIGS. 5 and 6 illustrate a flip chip device incorporating the structure of FIG. 3. FIG. 7 illustrates a thin film device incorporating the structure of FIG. 3.

FIG. 5 is a plan view of a large junction device (i.e. an area greater than or equal to one square millimeter). FIG. 6 is a cross section of the device shown in FIG. 5, taken along the axis indicated. FIGS. 5 and 6 also illustrate an arrangement of contacts that may be used with the semiconductor structure illustrated in FIG. 3. The device of FIGS. 5 and 6 is described in more detail in U.S. Pat. No. 6,828,586, which is incorporated herein by this reference. The entire semiconductor structure illustrated in FIG. 3 and described above in various examples is represented on FIG. 6 as epitaxial structure 110, grown on a growth substrate 10 which remains a part of the finished device. Multiple vias are formed in which n-type contacts 114 make electrical contact to n-type region 31 of FIG. 3. P-type contacts 112 are formed on the remaining portions of p-type region 39 of FIG. 3. The individual n-type contacts 114 formed in the vias are electrically connected by conductive regions 118. The device may be flipped relative to the orientation illustrated in FIGS. 5 and 6 and mounted on a mount (not shown) contact-side down such that light is extracted from the device through substrate 10. N-type contacts 114 and conductive regions 118 make electrical contact to the mount by n-type connection region 124. Underneath n-type connection region 124, the p-type contacts 112 are isolated from n-type contacts 114, conductive regions 118, and n-type connection region 124 by dielectric 116. P-type contacts 112 make electrical contact to the mount by p-type connection region 122. Underneath p-type connection region 122, n-type contacts 114 and conductive regions 118 are isolated from p-type connection region 122 by dielectric 120.

FIG. 7 is a cross sectional view of a thin film device, a device from which the growth substrate is removed. The device illustrated in FIG. 7 may be formed by growing the semiconductor structure 57 of FIG. 3 on a conventional growth substrate 58, bonding the device layers to a host substrate 70, then removing growth substrate 58. For example, n-type region 31 is grown over substrate 58. N-type region 31 may include optional preparation layers such as buffer layers or nucleation layers, and optional release layers designed to facilitate release of the growth substrate or thinning of the epitaxial layers after substrate removal. Light emitting region 35 is grown over n-type region 31, followed by p-type region 39. Light emitting region 35 may be sandwiched between optional first and second spacer layers 33 and 37. One or more metal layers 72, including, for example, ohmic contact layers, reflective layers, barrier layers, and bonding layers, are deposited over p-type region 39.

The device layers are then bonded to a host substrate 70 via the exposed surface of metal layers 72. One or more bonding layers (not shown), typically metal, may serve as compliant materials for thermo-compression or eutectic bonding between the epitaxial structure and the host substrate. Examples of suitable bonding layer metals include gold and silver. Host substrate 70 provides mechanical support to the epitaxial layers after the growth substrate is removed, and provides electrical contact to p-type region 39. Host substrate 70 is generally selected to be electrically conductive (i.e. less than about 0.1 Ωcm), to be thermally conductive, to have a coefficient of thermal expansion (CTE) matched to that of the epitaxial layers, and to be flat enough (i.e. with an root mean square roughness less than about 10 nm) to form a strong wafer bond. Suitable materials include, for example, metals such as Cu, Mo, Cu/Mo, and Cu/W; semiconductors with metal contacts, such as Si with ohmic contacts and GaAs with ohmic contacts including, for example, one or more of Pd, Ge, Ti, Au, Ni, Ag; and ceramics such as AlN, compressed diamond, or diamond layers grown by chemical vapor deposition.

The device layers may be bonded to host substrate 70 on a wafer scale, such that an entire wafer of devices are bonded to a wafer of hosts, then the individual devices are diced after bonding. Alternatively, a wafer of devices may be diced into individual devices, then each device bonded to host substrate 70 on a die scale, as described in more detail in U.S. application Ser. No. 10/977,294, "Package-Integrated Thin-Film LED," filed Oct. 28, 2004, and incorporated herein by reference.

Host substrate 70 and semiconductor structure 57 are pressed together at elevated temperature and pressure to form a durable bond at the interface between host substrate 70 and metal layers 72, for example a durable metal bond formed between metal bonding layers (not shown) at the interface. The temperature and pressure ranges for bonding are limited on the lower end by the strength of the resulting bond, and on the higher end by the stability of the host substrate structure, metallization, and the epitaxial structure. For example, high temperatures and/or high pressures can cause decomposition of the epitaxial layers, delamination of metal contacts, failure of diffusion barriers, or outgassing of the component materials in the epitaxial layers. A suitable temperature range for bonding is, for example, room temperature to about 500° C. A suitable pressure range for bonding is, for example, no pressure applied to about 500 psi. Growth substrate 58 is then removed.

In order to remove a sapphire growth substrate, portions of the interface between substrate 58 and semiconductor structure 57 are exposed, through substrate 58, to a high fluence pulsed ultraviolet laser in a step and repeat pattern. The exposed portions may be isolated by trenches etched through the crystal layers of the device, in order to isolate the shock wave caused by exposure to the laser. The photon energy of the laser is above the band gap of the crystal layer adjacent to the sapphire (GaN in some embodiments), thus the pulse energy is effectively converted to thermal energy within the first 100 nm of epitaxial material adjacent to the sapphire. At sufficiently high fluence (i.e. greater than about 500 mJ/cm$^2$) and a photon energy above the band gap of GaN and below the absorption edge of sapphire (i.e. between about 3.44 and about 6 eV), the temperature within the first 100 nm rises on a nanosecond scale to a temperature greater than 1000° C., high enough for the GaN to dissociate into gallium and nitrogen gasses, releasing the epitaxial layers from substrate 58. The resulting structure includes semiconductor structure 57 bonded to host substrate 70. In some embodiments, the growth substrate may be removed by other means, such as etching, lapping, or a combination thereof.

After the growth substrate is removed, semiconductor structure 57 may be thinned, for example to remove portions of n-type region 31 closest to substrate 58 and of low material quality. The epitaxial layers may be thinned by, for example, chemical mechanical polishing, conventional dry etching, or photoelectrochemical etching (PEC). The top surface of the epitaxial layers may be textured or roughened to increase the amount of light extracted. A contact (not shown) is then formed on the exposed surface of n-type region 31. The n-contact may be, for example, a grid. The layers beneath the n-contact may be implanted with, for example, hydrogen to prevent light emission from the portion of light emitting region 35 beneath the n-contact. Secondary optics known in the art such as dichroics or polarizers may be applied onto the emitting surface to provide further gains in brightness or conversion efficiency.

Figure 8:
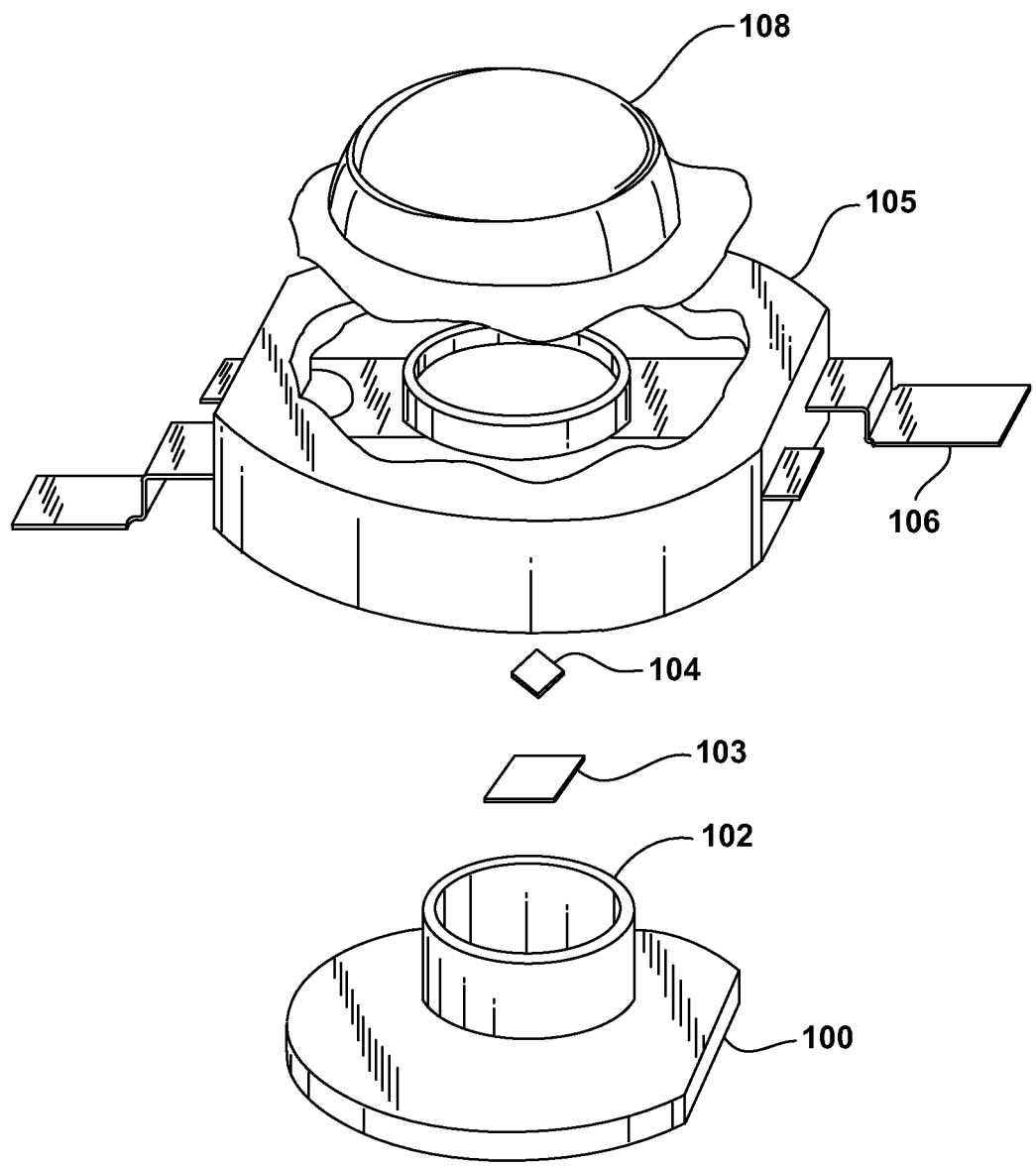
FIG. 8 is an exploded view of a packaged light emitting device.

FIG. 8 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A semiconductor light emitting device comprising:
an n-type region;
a p-type region; and
a light emitting region disposed between the n-type region and the p-type region in a double-heterostructure that includes only a single III-nitride light emitting layer, this light emitting layer being the only layer in the device from which light is produced when current flows between the n-type and p-type regions;
wherein the light emitting layer has a thickness between 100 Å and 600 Å, and at least a portion of the light emitting layer has a graded composition,
wherein an InN composition in the light emitting layer is graded from a first InN composition in a first portion of the light emitting layer closest to the n-type region to a second InN composition in a second portion of the light emitting layer closest to the p-type region, wherein the first InN composition is greater than the second InN composition,
wherein the InN composition is graded linearly from the first InN composition to the second InN composition.

2. The semiconductor light emitting device of claim 1 wherein the light emitting layer is InGaN.

3. The semiconductor light emitting device of claim 1 wherein the light emitting layer is doped with an n-type dopant.

4. The semiconductor light emitting device of claim 1 wherein the light emitting layer has a thickness between 100 Å and 250 Å.

5. The semiconductor light emitting device of claim 1 further comprising a step change in InN composition between the light emitting layer and a portion of the n-type region.

6. The semiconductor light emitting device of claim 1, including a preparation layer that includes indium and is disposed between the n-type region and the light emitting region; wherein the first InN composition is greater than an InN composition in the preparation layer.

7. The semiconductor light emitting device of claim 1, including a preparation layer that includes indium and is disposed between the n-type region and the light emitting region.

8. The semiconductor light emitting device of claim 7, including a spacer layer disposed between the preparation layer and the light emitting region.

9. The semiconductor light emitting device of claim 7, wherein the preparation layer is an n-type layer.

10. The semiconductor light emitting device of claim 7, wherein the preparation layer includes 2% to 12% InN.

11. The semiconductor light emitting device of claim 7, wherein the preparation layer includes 2% to 6% InN.

12. The semiconductor light emitting device of claim 1, including a blocking layer that includes a compound of AlN and is disposed between the p-type region and the III-nitride light emitting region.

13. The semiconductor light emitting device of claim 12, wherein the blocking layer comprises $Al_xGa_{1-x}N$, and x is greater than 0.08.

14. The semiconductor light emitting device of claim 13, wherein the blocking layer comprises $Al_xGa_{1-x}N$, and x is less than 0.30.

15. The semiconductor light emitting device of claim 12, wherein the blocking layer is at least 10 Angstroms thick.

16. The semiconductor light emitting device of claim 15, wherein the blocking layer is less than 1000 Angstroms thick.

17. A semiconductor light emitting device comprising:
an n-type region;
a p-type region; and
a light emitting region disposed between the n-type region and the p-type region in a double-heterostructure that includes only a single III-nitride light emitting layer, this light emitting layer being the only layer in the device from which light is produced when current flows between the n-type and p-type regions;
wherein the light emitting layer has a thickness between 100 Å and 600 Å, and at least a portion of the light emitting layer has a graded composition,
wherein the composition of the light emitting layer is graded monotonically across the light emitting layer.

18. A semiconductor light emitting device comprising:
an n-type region;
a p-type region;

a light emitting region disposed between the n-type region and the p-type region in a double-heterostructure that includes only a single III-nitride light emitting layer, this light emitting layer being the only layer in the device from which light is produced when current flows between the n-type and p-type regions;

a preparation layer that includes indium and is disposed between the n-type region and the light emitting region;

a first spacing layer that does not include Al and is disposed between the preparation layer and the light emitting region;

a blocking layer that includes a compound of AlN and is disposed between the p-type region and the III-nitride light emitting region; and a second spacing layer that does not include Al and is disposed between the blocking layer and the III-nitride light emitting region;

wherein the light emitting layer has a thickness between 100 Å and 600 Å, and at least a portion of the light emitting layer has a graded composition.

19. The semiconductor light emitting device of claim 18, wherein the preparation layer includes 2% to 12% InN.

\* \* \* \* \*